United States Patent [19]

Pasch

[11] Patent Number: 5,776,551

[45] Date of Patent: Jul. 7, 1998

[54] USE OF PLASMA ACTIVATED $NF_3$ TO CLEAN SOLDER BUMPS ON A DEVICE

[75] Inventor: Nicholas F. Pasch, Pacifica, Calif.

[73] Assignee: LSI Logic Corporation, Milpitas, Calif.

[21] Appl. No.: 771,955

[22] Filed: Dec. 23, 1996

[51] Int. Cl.$^6$ .................................................. C23C 14/02
[52] U.S. Cl. ......................... 427/534; 156/281; 427/96; 427/126.1; 427/294; 427/399; 427/535; 427/569
[58] Field of Search ..................... 427/534, 535, 427/569, 96, 126.1, 294, 399; 156/281

[56] References Cited

U.S. PATENT DOCUMENTS 4,921,157  5/1990  Dishon et al. ........................ 228/124
5,407,121  4/1995  Koopman et al. ..................... 228/206
5,499,754  3/1996  Bobbio et al. ......................... 228/42

*Primary Examiner*—Bernard Pianalto
*Attorney, Agent, or Firm*—Beyer & Weaver, LLP

[57] ABSTRACT

A method for cleaning solder bumps on a substrate that may be employed in a flip-chip design, for example, is described. The method of cleaning includes placing the substrate having the solder bumps into a plasma reactor, introducing a source gas including nitrogen trifluoride gas into the plasma reactor, striking a plasma from the source gas in the plasma reactor, and forming a fluoride compound on the surface of the solder bump.

9 Claims, 1 Drawing Sheet

USE OF PLASMA ACTIVATED NF₃ TO CLEAN SOLDER BUMPS ON A DEVICE

BACKGROUND OF THE INVENTION

This invention relates to cleaning fluxless solder bumps on an integrated circuit (IC). More particularly, this invention relates to using nitrogen trifluoride ($NF_3$) as a source gas to generate a plasma for cleaning fluxless solder bumps in a flip-chip design.

In integrated circuit (IC) technology, connections to a semiconductor chip or an IC are typically made by peripheral connections or bond pads, which are located on the periphery or perimeter of the IC and positioned as close together as possible, i.e. the bond pads are typically spaced apart by a distance of between about 75 and about 100 µm. The distance between two bond pads is limited, however, in part by the ability of the bond pad equipment to place them as close as possible. In high performance ICs, where many logic circuits are implemented for example, the number of bond pad connections required on the IC to enable the necessary connections far exceeds the number of bond pads available on the IC. As a result, there is often a shortage of perimeter space on the IC with respect to the required amount of bond pads to implement a somewhat complicated circuit design on the IC. This limitation of perimeter space on the IC is well known in the art and commonly referred to as the "pad limited design".

FIG. 1 shows an example of a solder bump array, which is generally implemented in a "flip-chip" design and provides a much higher density of IC connections per area not attainable by the peripheral bond pad connections. The solder bump array, therefore, provides a viable solution to the above described problem of shortage of available perimeter space on the IC. As shown, an IC solder bump design 100 typically includes a die 102 having solder bumps 104 covering a substantial portion of the face of die 102. The diameter of solder bumps 102 may generally range from between about 50 to about 100 µm and is typically about 75 µm in diameter. Solder bumps typically include a lead-tin alloy having elemental compositions of about 5% tin and about 95% lead.

One method employed to create solder bumps involves forming a thin molybdenum mask having holes or openings, which designate the location of the solder bumps. The mask is then brought into close proximity to an IC. The IC covered by the mask is then exposed to metallic vapors containing such metals as lead, tin, etc. The metallic vapors travel through the holes of the mask and form deposits or solder bumps on the IC. Another approach employs a photoresist mask as used in conventional photolithography. Photoresist provided on the IC is illuminated by light passing through a reticle containing a pattern specifying the locations of the solder bumps. After exposure and development of the photoresist, the unmasked areas on the IC surface are then electroplated to form tin-lead alloy solder bumps on the IC surface.

When solder bumps formed on an IC by one of the above-mentioned processes, for example, are exposed to air, the tin and/or lead composition of the solder bumps begins to undesirably oxidize. Over a period of hours, enough oxide forms to completely cover the surfaces of the solder bumps with "dross," which is a collection of oxides and metals. As is well known to those skilled in the art, dross has a much higher melting point than the metal itself. Furthermore, it is electrically non-conductive and relatively rigid. Consequently, when the IC is heated to undergo connection to an IC package, the solder does not easily flow or wet adjacent surfaces. Therefore, the IC—package connection is often incomplete, leading to low yield.

To overcome this difficulty, conventional acid fluxes or milder rosin fluxes are introduced to the solder formulation. The acids in the flux can effectively solubilize dross. Alternatively or concurrently, the flux can attack the underlying solder metal, forming volatile or gaseous byproducts that are known to disperse the overlying oxide and thereby remove the dross.

Unfortunately, the application of flux to the solder formulation can be a difficult task as it entails applying a relatively sticky, reactive organic material on closely spaced solder bumps sometimes positioned no more than about 50 µm apart. Further, any flux remaining on an IC for extended periods of time can undesirably corrode or otherwise attack other IC components that include metal. This problem is compounded by the hygroscopic nature of many fluxes which brings water into close proximity with the IC materials.

Thus, it becomes imperative to quickly remove residual flux after the soldering operation is complete. Unfortunately, removing fluxes from the solder bumps is also a cumbersome and arduous task. Generally, the solder bumps are heated and exposed to a cleaning fluid in order to remove flux. Unfortunately, the small distances (e.g., 50 µm) between the solder bumps creates a tortuous pathway that resists penetration by clearing fluids. Furthermore, the cleaning fluids such as chlorofluoro-carbons (CFCs) pose environmental dangers. Therefore, the use of fluxless solder in solder bumps has emerged as a viable solution in eliminating the problems associated with using fluxes in solder formulations.

One such fluxless technology is known as "Plasma Activated Dry Soldering." This process is carried out in a plasma reactor where a source gas, such as $SF_6$, is used to generate a plasma containing sulfur and fluorine free radicals and ions. The fluorine free radicals react with the tin and/or lead in the solder formulation and form tin and/or lead fluoride. As a result, the fluoride on the solder bump surface displaces any oxide that may have already formed and inhibits formation of any further oxide.

Although, it appears that oxygen will eventually react with the solder bump surface and displace the fluoride, the solder bump surface remains oxide free for at least a few days during which time it may be stored in a normal atmosphere. Even if some oxide does form on the solder surface, the fluoride compounds can serve as a mild flux during subsequent soldering. Specifically, when the solder bump containing tin or lead fluoride is heated for attaching to a package for example, the fluorides, i.e. tin or lead fluoride, act as mild acids. Such acids effectively flux both the solder bumps and the package that is intended to be connected to the solder bumps. The resulting soldered device need not be cleaned, as no external flux was applied. Any residual metal fluorides are somewhat soluble in the solder metal. Therefore, they do not remain concentrated on the solder surface.

Unfortunately the plasma activated dry soldering has certain draw backs. First, the use of $SF_6$ or $CF_4$ as a source gas during plasma decomposition results in the deposition of solid sulfur residue on the side-walls of the plasma reactor interior. The build up of sulfur or carbon residue requires periodic cleaning, which results in a low throughput for the solder bump cleaning process.

Second, as the state of the IC art moves to smaller and smaller feature sizes, the magnitude of the solder bump diameter accordingly decreases (approaching values below 50 μm, for example). Particulates that are innocuous in larger designs are no longer harmless to ICs having smaller solder bumps. Thus, the sulfur or carbon residues that necessarily form on the IC surface as a result of the decomposition reaction of the $SF_6$ or $CF_4$ may include particulates that interfere with the soldering process.

Therefore, what is needed is a process for effectively cleaning and fluoridating solder bumps without generating residues or particulates that deposit in the plasma reactor or on the IC surface.

SUMMARY OF THE INVENTION

To achieve the foregoing, the present invention provides a method for cleaning solder bumps on a substrate (e.g., a flip-chip design). The method of cleaning includes placing the substrate having the solder bumps into a plasma reactor, introducing a source gas including nitrogen trifluoride ($NF_3$) gas into the plasma reactor, striking a plasma from the source gas in the plasma reactor, and forming a fluoride compound on the surface of the solder bump.

The step of striking the plasma may include generating the plasma under a pressure of between about 5 milliTorr and about 1 Torr. The power may generally range from between about 50 to about 1000 Watts, and preferably range from about 300 to about 500 Watts.

The step of introducing the source gas may include introducing nitrogen trifluoride gas at a flow rate of between about 10 cubic centimeter/minute and 1 standard liter/minute. The source gas may include nitrogen trifluoride gas, helium or some other inert gas. By way of example, the source gas may include between 0 and about 95% by volume of helium gas and up to about 5% by volume of nitrogen trifluoride.

The present invention also provides a method for attaching a solder bump to a surface, such as an IC package, having a conductive connection region. The method for attaching includes cleaning a solder bump according to the process mentioned above, bringing into close proximity the solder bump to the connection region of the surface and heating the solder bump such that the solder bump flows into the connection region to establish a contact with the surface. In one embodiment of the present invention, the method of attaching may be carried out in the same plasma reactor that was used for cleaning.

In another aspect, the present invention provides a substrate having a plurality of solder bumps with fluoride coatings. The fluoride coatings are formed by the following steps: placing the substrate having the solder bumps into a plasma reactor; introducing a source gas including nitrogen trifluoride gas into the plasma reactor; striking a plasma from the source gas in the plasma reactor; and forming the fluoride coating on the surface of the solder bump.

In yet another aspect, the present invention provides an integrated circuit (IC) substrate including a plurality of solder bumps with fluoride coatings provided thereon, wherein the IC surface is substantially free of carbon or sulfur particles. The solder bumps may include a tin solder, and the fluoride coatings may include at least one of tin fluoride and lead fluoride. The substrate and solder together may form a flip-chip. ICs as described are particularly important in designs employing small feature sizes. Thus, in one embodiment, the IC may have solder bumps of at most about 100 μm (preferably less than 50 μm) separated by no more than about 100 μm (more preferably no more than about 50 μm).

The present invention represents a significant improvement over the prior art. The cleaning process, according to the present invention, does not produce solid carbon or sulfur residue, which is typically found in the plasma reactors employed in the prior art. As a result, the reaction chamber in the plasma reactors of the prior art do not need to be cleaned as frequently as the reaction chambers of the prior art. Having little or almost no residue inside the reaction chamber also reduces the likelihood that devices having solder bumps of small sizes, e.g., about 50 μm or less, will not suffer from device failure.

DETAILED DESCRIPTION OF THE PREFERRED EMBODIMENTS

The present invention employs nitrogen trifluoride ($NF_3$) as a source gas to generate a plasma to clean solder bumps commonly used in a flip-chip design, for example. In the following description, numerous specific details are set forth in order to fully illustrate a preferred embodiment of the present invention. It will be apparent, however, that the present invention may be practiced without limitation to some specific details presented herein.

Figure 2:
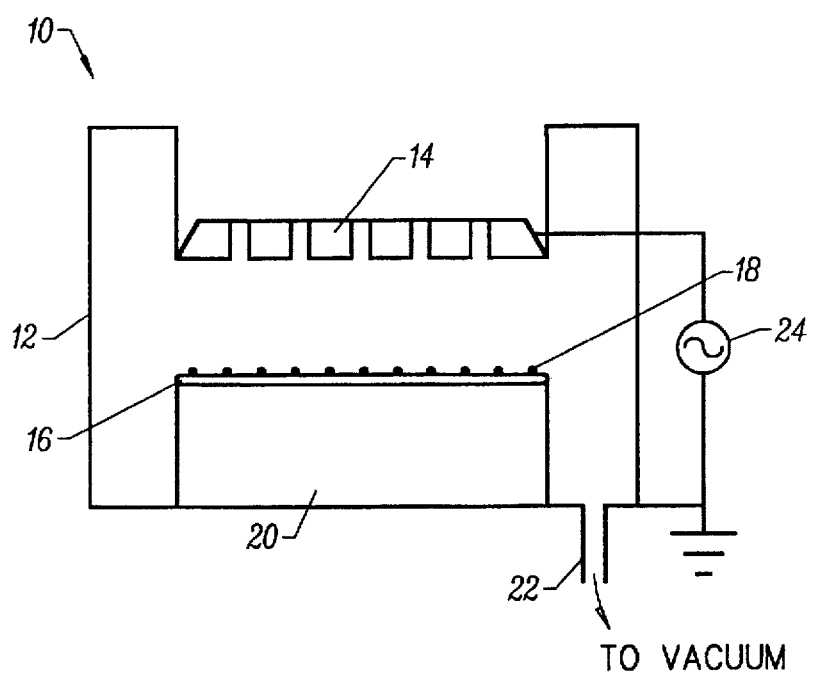
FIG. 2 is a side-sectional view of a representative plasma reactor employed to effectively clean solder bumps.

FIG. 2 is a representation of a typical plasma reactor system that may be employed to clean solder bumps on an IC in accordance with one aspect of the present invention. Now referring to this figure, a plasma reactor 10 has a reaction chamber 12. The interior walls of reaction chamber 12 are preferably made of Series 300 and 400 stainless steel, aluminum with thick anodized coating, or other materials well known in the art. Generally, the chamber interior should contain materials exhibiting a high resistance to attack by fluorine or fluorine ions. Chamber 12 is provided with a shower head 14, which is energized by a RF generator 24, e.g., at 13.56 MHz or other suitable frequencies, typically via a matching network (not shown to simplify the illustration). Shower head 14 preferably includes a plurality of holes for releasing the source gas, nitrogen trifluoride $NF_3$, into the RF-induced plasma region between itself and a die 16. Alternatively, a microwave may be employed as a power source and $NF_3$ may be released from ports built into the walls of chamber 12 itself.

Die 16, generally containing a plurality of solder bumps 18, is supported on a chuck 20, which may act as a second electrode and may be biased by the same radio frequency generator 24 (also typically via a matching network). Solder bumps 18 have a diameter that is typically between about 50 μm and about 100 μm and are separated typically by a distance of between about 50 μm and about 100 μm. As the device technology moves to smaller and smaller feature sizes, however, a reduction in the solder bump diameter to values below 50 μm, e.g., about 20 μm, is expected. This size reduction will be accompanied by a corresponding increase in solder bump density and reduction in the distance separating the solder bumps, i.e. below about 50 μm.

Figure 1:
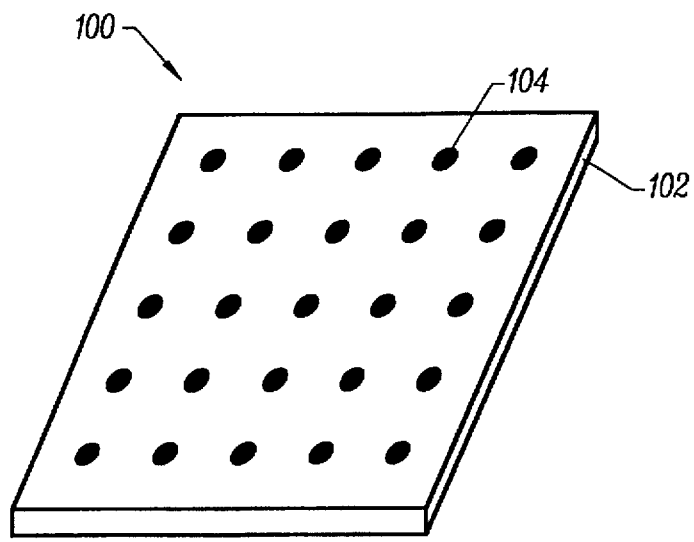
FIG. 1 shows the top view of a typical solder bump array as it may be formed on the face of a die used in a flip-chip package design.

A mechanical or electrostatic clamp (not shown) may be installed inside some reaction chambers to adequately secure die 11 to chuck 20. To provide a path to ground, the walls of chamber 12 are typically grounded as shown in FIG. 1. Chamber 12 is typically equipped with an outlet 20 that connects to a vacuum pump, e.g. a turbomolecular pump, to evacuate the gaseous materials inside chamber 12 and maintain a desired reactor pressure.

It is preferable to employ reaction chambers that have interior side-walls, which do not include consumable dielectrics because $NF_3$ and other fluorine containing compounds are known to be extremely reactive and rapidly attack and damage such materials. It may be preferable to employ a plasma reactor similar to those designed for performing oxide etchings. Such reactors may include a fluorine-resistant carbon-oxygen based passivating layer formed in the interior of the chamber side-walls. The passivating layer provides a protective coating that prevents the degradation of the reactor side-walls due to highly reactive atomic smashing generally associated with $NF_3$. It should be borne in mind, however, that the invention is not limited to this particular configuration. By way of example, a variety of reactors that are available from Lam Research Corporation of Fremont, Calif. and Applied Materials of Santa Clara, Calif. will work well.

In one embodiment, a cleaning process according to the present invention begins when die 16, containing solder bumps 18, is secured, e.g., by mechanical or electrostatic clamp, on chuck 20 inside reaction chamber 12. A source gas, such as $NF_3$, is introduced into reaction chamber 12 via shower head 14. The source gas may alternatively include $NF_3$ and up to 95% of an inert gas, such as helium. RF generator 24 is then turned on to energize shower head 14, which acts as an electrode. Shower head 14 transmits the RF energy to reaction chamber 12 containing the source gas, and thereby strikes a plasma.

While wishing not to be bound by theory, it is believed that $NF_3$ gas, in its plasma state, decomposes to form at least atomic nitrogen, fluorine free radicals and fluoride ions. The fluorine and fluoride species then react with the tin, lead-tin or tin-lead based alloys at the surface of the solder bumps to produce tin fluoride and/or lead fluoride. The solder bumps are exposed to the plasma inside chamber 12 for a sufficient period of time to cover most, if not all, of the solder bumps surfaces with tin fluoride and/or lead fluoride. Such conversion might typically take between about ½ to about 3 minutes, depending upon reaction conditions. As mentioned above, tin and/or lead fluoride acts as an oxidation resistant material preventing the oxidation of the solder bump surface for a period of up to about one week. Hence, for up to about one week of exposure to air, the solder bumps on an IC cleaned according to the present invention do not exhibit reflow problems when connecting to electronic packages, for example. This is a marked improvement over the unfluoridated solder bumps which had a very short shelf life. As mentioned, it is believed that the tin and lead fluorides produced in accordance with this invention are at least partially soluble in the tin or lead-tin based solder alloys. Thus, any fluoride that remains after the solder process may dissolve (at least partially) into the solder bump interior.

The fluoridated solder bumps of this invention may be bonded to an appropriate substrate by conventional flip chip bonding procedures. First, the solder bump and connection region of the substrate are brought into close proximity. Then, the solder bumps are heated to a temperature at which they flow into the connection region to establish a contact with the substrate. Examples of the connection regions include conductive contact regions of an IC package or a test socket or a circuit board. Thus, the bonding process is very similar to the process employed in conventional IC soldering operations, except that no flux is employed.

Because the source gas of the present invention includes $NF_3$ as the active reactant, it produces no solid decomposition products—unlike source gases such as $SF_6$ and $CF_4$ (which produce sulfur and carbon residues). Rather, all decomposition products are gaseous: fluorine and nitrogen. Such byproducts are simply evacuated out of chamber 12 through outlet 22, typically by a vacuum pump. Therefore, the reactant cleaning gases of this invention will not cause residue to undesirably accumulate on the IC and elsewhere inside the reaction chamber. Note that the processes of the present invention may employ other residue-free gases such as $NF_2Cl$ and $NF_2H$, for example.

Plasma reactors employed in the methods of the present invention, which produce little or almost no accumulated plasma residue inside the chamber, do not require frequent cleaning, as is necessary in the plasma reactors employing $SF_6$, $CF_4$, or other solid producing gases. Therefore the process of cleaning solder bumps according to the present invention results in higher throughputs than methods employing such solid-producing gases.

Further, the substantially residue free environment inside the reaction chamber may result in a significantly higher device yield, particularly for those devices having small solder bump sizes. As mentioned above, cleaning gases such as $SF_6$ and $CF_4$, produce carbon and sulfur residue on decomposition. Therefore, some solid particles deposit on the IC surface. If those particles are large enough in comparison to the size of the solder bumps, they may interfere with soldering process by preventing some solder bumps from contacting connection regions on a substrate or by causing hot solder to flow under or around particles, for example. Thus, solid decomposition products of cleaning gases will, at least, make soldering more difficult, and might cause device failure. It is believed that this problem will become more significant as solder bump sizes decrease below about 50 µm (and solder bump separation distances of less than about 50 µm). In the methods of the present invention, however, the risk of such problems is significantly reduced because the use of $NF_3$ ensures a substantially residue free environment.

While solid residues resulting from decomposition of reactant gases could, in theory, be cleaned from the IC surface, the cleaning step will add to the IC's manufacturing cost. ICs manufactured in accordance with the present invention therefore will be less expensive.

In a preferred embodiment, the invention provides devices having solder bumps with fluoride coatings and substantially no solid particles on their surfaces—and particularly no sulfur or carbon residues that might result from decomposition of $SF_6$, $CF_4$, or $CF_2Cl_2$, for example. Such devices have relatively long shelf-lives by virtue of their fluoride coatings. They also reliably mount to substrates because they do not have large particles interfering with the mounting process.

Table 1 sets forth the approximate parameters employed in typical, commercially available plasma reactors to clean solder bumps, in accordance with one embodiment of the present invention. The parameters of the solder bump cleaning process shown in Table 1 include pressure, power, and flow rates of the source gas. Approximate scaling of the parameters may be performed, as can be appreciated by those skilled in the art, to accommodate chamber volumes that significantly vary from the norm.

TABLE 1

| Parameters | Approximate Range Of Values |
| --- | --- |
| Pressure | 5 milliTorr–1 Torr |
| Power | 50–1000 Watts |
| Flow rate | 10 sccm–1 std. liter/minute |

Pressure refers to the pressure measured inside reaction chamber 12 during the cleaning process. The pressure of the source gas is generally between about 5 milliTorr and about 1 Torr. Power refers to the power output of RF source 24. The power is generally between about 50 and about 1000 Watts and preferably between about 300 and about 500 Watts. Flow rate refers to the flow rate of the source gas including $NF_3$ into reaction chamber 12. The flow rate is generally between about 10 sccm and about 1 standard liter per minute.

In order to use the solder bumps cleaned in accordance with this invention, a fluxless solder reflow process is carried out to join the solder bumps to a surface, such as an IC package. In one embodiment of the present invention, the solder bumps are brought into close proximity to a connection region of the surface. The solder bumps are heated such that they flow into the connection region to establish a contact between the solder bumps and the surface.

Alternatively the reflow process is performed directly after the cleaning process and is carried out in the plasma reactor described above. According to this embodiment, the solder bumps reflow into a connection region of a surface, such as an IC package, in a continuous mode in the same reaction chamber that has been used for cleaning, and thereby establish a contact between the solder bumps and the surface. One advantage of this approach is that reflow is carried out within a plasma reactor outside the presence of ambient air. This eliminates the reoxidation of the solder bump surface. However, it requires that the substrate to which the IC is mounted is introduced to the reaction chamber at the appropriate time. In preferred embodiments, the substrate is cleaned together with the solder bumps, thereby ensuring that both surfaces are clean when the soldering operation takes place.

Although the foregoing invention has been described in some detail for purposes of clarity of understanding, it will be apparent that certain changes and modifications may be practiced within the scope of the appended claims. For example, while the specification has described the inventive process being used to clean flip-chips, the process could be employed to clean other surfaces such as the solder in a ball grid array or the copper in a package substrate. Therefore, the present embodiments are to be considered as illustrative and not restrictive, and the invention is not to be limited to the details given herein, but may be modified within the scope of the appended claims.

What is claimed is:

1. A method for cleaning solder bumps on a substrate, said method comprising:

placing said substrate having said solder bumps into a plasma reactor;

introducing a source gas including nitrogen trifluoride gas into said plasma reactor;

striking a plasma from said source gas in said plasma reactor; and forming a fluoride compound on the surface of said solder bump.

2. The method of claim 1, wherein said step of striking said plasma comprises generating said plasma under a pressure of between about 5 milliTorr and about 1 Torr.

3. The method of claim 1, wherein said step of striking said plasma comprises generating said plasma at a power of between about 50 and 1000 Watts.

4. The method of claim 3, wherein said power is between about 300 and 500 Watts.

5. The method of claim 1, wherein said step of introducing said source gas comprises introducing nitrogen trifluoride gas at a flow rate of between about 10 cubic centimeter/minute to 1 standard liter/minute.

6. The method of claim 1, wherein said step of introducing said source gas comprises introducing nitrogen trifluoride gas and helium.

7. The method of claim 1, wherein said source gas comprises between 0 and about 95% by volume of helium gas and up to about 5% by volume of nitrogen trifluoride.

8. A method for attaching a solder bump to a surface having a connection region, said method comprising:

cleaning said solder bump according to claim 1;

bringing into close proximity said solder bump to a connection region of a surface; and heating said solder bump such that said solder bump melts and flows into said connection region to establish a contact with said surface.

9. The method of claim 8, wherein said step of cleaning and said step of bringing are conducted in said plasma reactor.

\* \* \* \* \*